United States Patent
Magana et al.

(10) Patent No.: US 12,209,975 B2
(45) Date of Patent: Jan. 28, 2025

(54) REAL-TIME DETECTION OF DEFLECTIONS AND RUPTURES OF EUV PELLICLE MEMBRANES

(71) Applicant: Intel Corporation, Santa Clara, CA (US)

(72) Inventors: John Ferdinand Magana, San Jose, CA (US); Guojing Zhang, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 184 days.

(21) Appl. No.: 17/883,678

(22) Filed: Aug. 9, 2022

(65) Prior Publication Data
US 2024/0053281 A1    Feb. 15, 2024

(51) Int. Cl.
*G01N 21/958*    (2006.01)

(52) U.S. Cl.
CPC ... *G01N 21/958* (2013.01); *G01N 2201/0636* (2013.01)

(58) Field of Classification Search
None
See application file for complete search history.

(56) References Cited

U.S. PATENT DOCUMENTS

| 6,346,986 B1* | 2/2002 | Nguyen | G03F 1/64 430/4 |
| 2003/0151731 A1* | 8/2003 | Hibbs | G03B 27/62 355/75 |
| 2020/0117097 A1* | 4/2020 | Jeunink | G03F 1/62 |
| 2021/0208500 A1* | 7/2021 | Vles | G03F 7/70983 |

FOREIGN PATENT DOCUMENTS

JP    2017053893 A    3/2017

OTHER PUBLICATIONS

European Search Report issued for the corresponding patent ayp-plication No. 23183033.2, dated Jan. 19, 2024, 8 pages (for informational purposes only).

* cited by examiner

*Primary Examiner* — Uzma Alam
*Assistant Examiner* — Chad Andrew Reverman
(74) *Attorney, Agent, or Firm* — Viering, Jentschura & Partner mbB

(57) ABSTRACT

The present disclosure is directed to a reticle assembly having a reticle and a pellicle attached to a pellicle support frame positioned on the reticle and includes a sensor assembly having optical and sensor components, which monitor the pellicle. The optical components and the sensor components of the sensor assembly may be coupled to a controller, which may be further coupled to one or more semiconductor process tools.

12 Claims, 12 Drawing Sheets

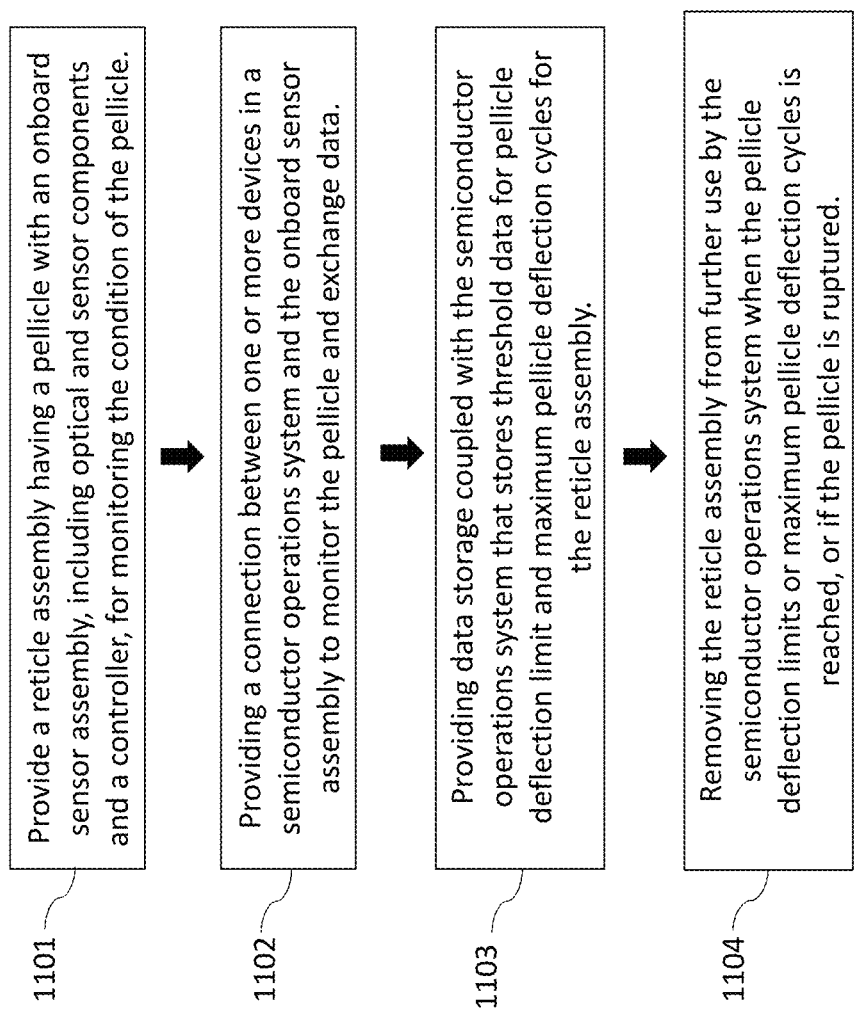

REAL-TIME DETECTION OF DEFLECTIONS AND RUPTURES OF EUV PELLICLE MEMBRANES

BACKGROUND

When extreme ultraviolet (EUV) lithography was first introduced into chip production at 7 nm in 2018, EUV pellicles were not ready. A pellicle is mounted on a mask, preventing particles from falling onto the reticle during the production process. Some chipmakers put EUV lithography into production without pellicles, and they manufactured advanced chips with mixed results (i.e., significant yield losses). EUV processes are more complex, and unwanted defects are smaller and more difficult to find, which makes having an EUV pellicle essential.

As a protective membrane for reticles (a.k.a. masks), the typical EUV pellicles will be inherently fragile and prone to breakage because they are ultra-thin (e.g., tens of nanometers thick) and macroscopically large (e.g., ~112 mm×144 mm). The EUV pellicles also need to be thin due to a transmittance requirement of higher than 90%. The present situation is that pellicle ruptures may occur at any step and/or location during the use and/or transport of the reticle assemblies. The transfer and/or use for printing of a reticle assembly with a ruptured EUV pellicle may result in an increased distribution of pellicle fragments throughout an EUV scanner body or other tools (e.g., mask inspection tool, pod transfer tool, etc.).

To help mitigate this problem, sensors have been incorporated into EUV scanners to detect a reticle assembly with ruptured pellicles, and windows have been added to EUV reticle transport pods to permit observation/detection of the presence of a ruptured pellicle. However, an EUV pellicle may rupture at times when unobserved (e.g., when a reticle assembly is in the reticle library), and the immediate detection of and/or techniques for preventing such ruptures are still not widely available.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIG. 11 shows a simplified flow diagram for a further exemplary method according to a further aspect of the present disclosure.

DETAILED DESCRIPTION

Figure 1:
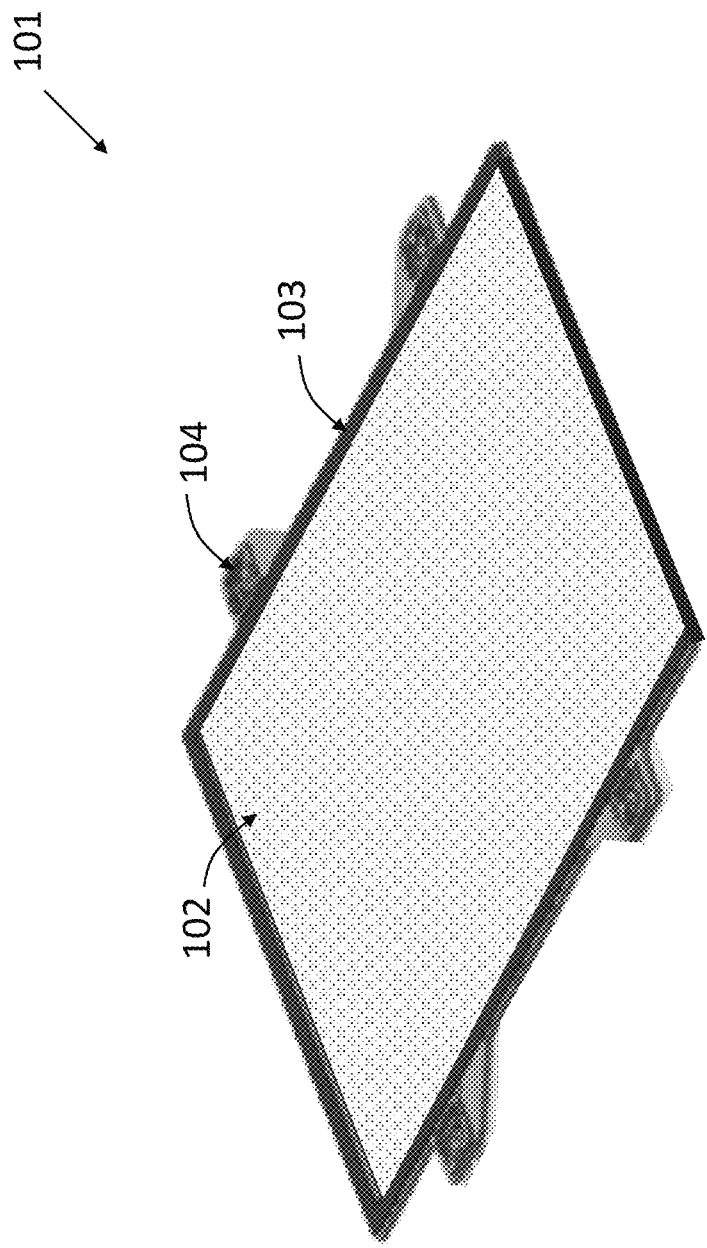
FIG. 1 shows an exemplary extreme ultraviolet (EUV) pellicle assembly according to an aspect of the present disclosure.

The following detailed description refers to the accompanying drawings that show, by way of illustration, specific details, and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

In an aspect, the present disclosure is directed to an onboard sensor assembly for real-time monitoring of EUV pellicle membrane deflections and ruptures. In particular, the sensor assembly has optical components, including a light source, a light detector, and a reflector, and sensor components, including a pressure sensor and an accelerometer. The optical and sensor components are coupled to a controller, which in turn is coupled to one or more semiconductor process tools. The sensor assembly monitors the EUV pellicle that is attached to a pellicle support frame positioned on a reticle, which are all parts of the reticle assembly.

In another aspect, the present disclosure is directed to a pellicle monitoring system for monitoring a plurality of reticle assemblies, with each reticle assembly having a reticle, an EUV pellicle, a pellicle support frame, optical components, and sensor components, for which the optical and sensor components generate signals relating to monitoring the movements and condition of the EUV pellicle. The pellicle monitoring system further includes a system controller configured to be coupled with the plurality of reticle assemblies to receive signals from their optical and sensor components, and a data storage coupled with the system controller for storing the signals received from each reticle assembly and providing threshold data for pellicle deflection limits and a maximum number of pellicle deflection cycles. The plurality of reticle assemblies may be used in a semiconductor process system for EUV lithography, and a reticle assembly can be removed when ruptured or approaching a failure/rupture event.

In another aspect, the present disclosure is directed to a method for monitoring a plurality of reticle assemblies, for which each reticle assembly has a reticle, an EUV pellicle, a pellicle support frame, optical components, and sensor components. The optical and sensor components, which may be discrete units attached to the pellicle support frame, or built into the pellicle support frame (i.e., as an integral part thereof), may generate signals relating to monitoring the movements and condition of the EUV pellicle. The method further provides a system controller configured to be coupled with the plurality of reticle assemblies for receiving signals from their optical and sensor components, and the system controller is further coupled to data storage that stores the signals received from each reticle assembly and provides threshold data for the limits of pellicle deflections and maximum permitted pellicle deflection cycles to the system controller. In the various aspects, the components of the sensor assembly, including the optical and sensor components, and the system controller may communicate, i.e., receive and transmit their signals, via wire/trace connections or wirelessly.

In a further aspect, the method may use a model-based algorithm to predict when an EUV pellicle membrane may fail and prevent further use of a potentially "failing" pellicle membrane before rupture. In addition, the method may include one of the plurality of reticle assemblies being removed from use by a semiconductor process system when the EUV pellicle for one of the plurality of reticle assemblies reaches its pellicle deflection limit or maximum number of pellicle deflection cycles, or when the EUV pellicle is ruptured.

The technical advantages of the present disclosure may include, but are not limited to:

(i) the real-time detection of pellicle rupture events using onboard sensor assembly positioned on the reticle assemblies and preventing the distribution of pellicle fragments throughout a given process tool, as well as obtaining highly accurate failure time-stamp data;

(ii) the prevention of EUV pellicle rupture events by taking reticle assemblies off-line based on rupture event predictions using data obtained from onboard sensor assemblies positioned on the reticle assemblies;

(iii) the generation of datasets that can be mined to determine optimum scanner operating conditions (e.g., optimum scan speed, energy, dwell between steps, etc.) that may lead to increased EUV pellicle durability by minimizing the magnitude of deflections and fewer pellicle ruptures;

(iv) an increase in wafer output and improved wafer yields by reducing scanner downtime; and (v) provide a rich dataset that can be paired with pellicle membrane fabrication data to improve the quality and durability of pellicles.

To more readily understand and put into practical effect the present reticle assemblies with onboard sensors designs and the methods for their use to improve the performance of semiconductor process systems, particular aspects will now be described by way of examples provided in the drawings that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

FIG. 1 shows an exemplary extreme ultraviolet (EUV) pellicle assembly 101 according to an aspect of the present disclosure. In this aspect, the pellicle assembly 101 includes an EUV pellicle 102 that may be a thin film or membrane attached to a pellicle support frame 103, which has a plurality of attachment members 104. The EUV pellicle 102 may be made of a plurality of materials, including dielectric materials (e.g., $SiO_2$, $SiN_x$, SiC, or graphite), conductive materials (e.g., metals), and/or semiconductors (e.g., polysilicon), and maybe tens of nanometers in thickness. The present pellicle assemblies may be configured with onboard sensor assemblies, which may be part of a reticle assembly as described below and may be fixedly or removably attached to a reticle.

In another aspect, the EUV pellicle 102 and pellicle support frame 103 may be made from a single layer of material, and the EUV pellicle 102 formed by back etching, or the EUV pellicle 102 may be synthesized by a plurality of means well known to those skilled in the art, including via chemical vapor deposition, physical vapor deposition, ion beam deposition, and atomic layer deposition onto a metal catalyst, and attached to the pellicle support frame 103.

Figure 2A:
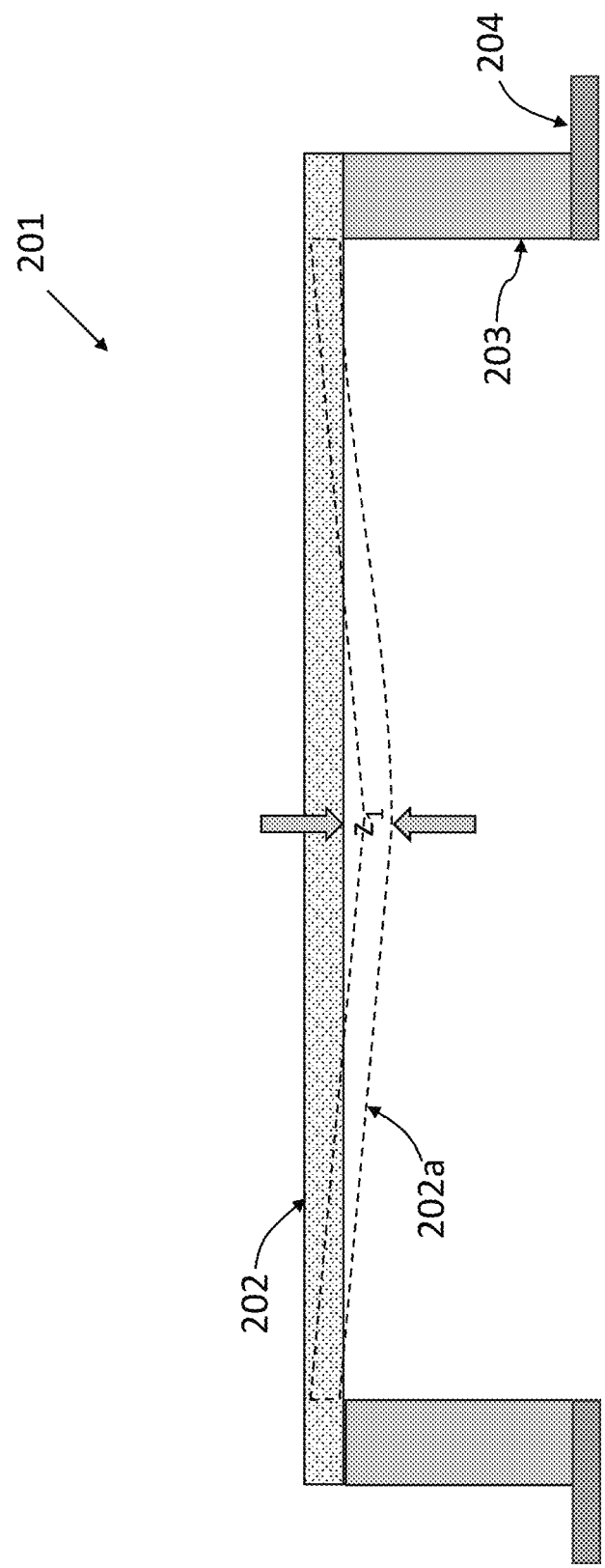
FIGS. 2A and 2B show representative drawings of the deflection movements of an exemplary EUV pellicle according to an aspect of the present disclosure.
Figure 2B:
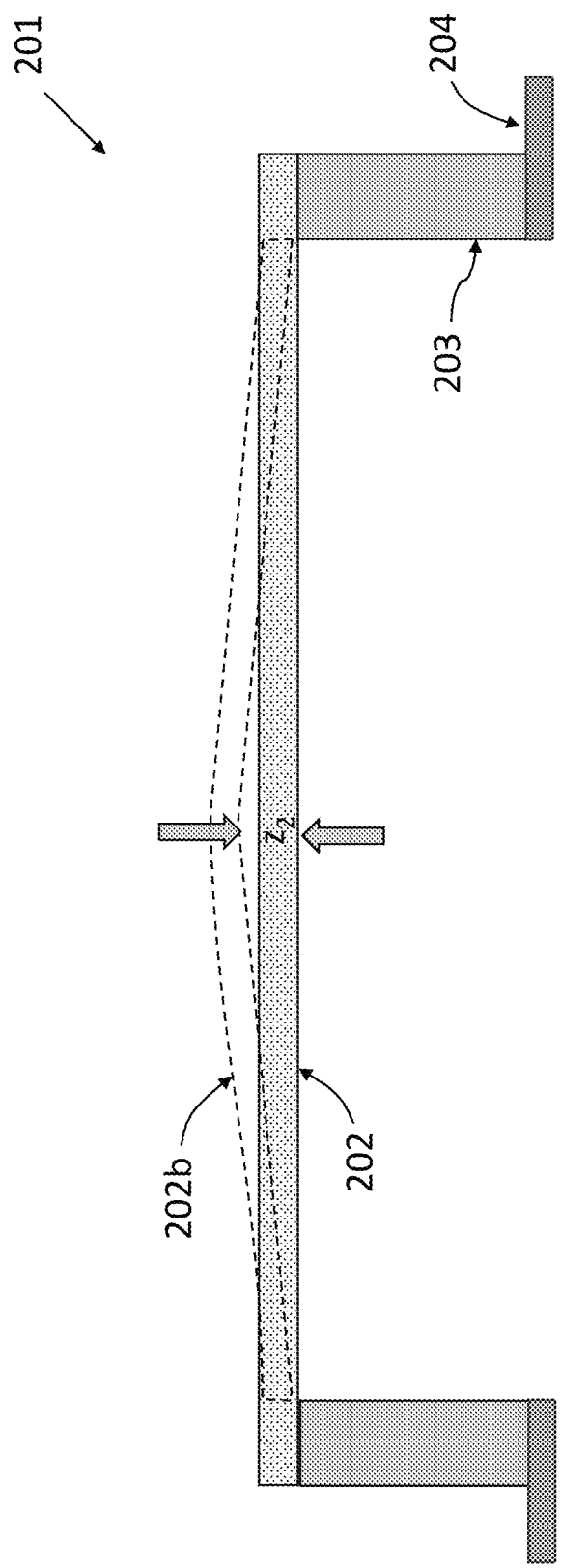

FIGS. 2A and 2B show representative drawings of the deflection movements of an exemplary EUV pellicle 202 according to various aspects of the present disclosure. As shown in FIG. 2A, the EUV pellicle 202 may be attached to a pellicle support frame 203 having attachment members 204, which are components of a pellicle assembly 201. In this aspect, the EUV pellicle 202 may have a downward deflection movement that produces a concave shape 202a and a displacement $Z_1$ from its neutral position. As shown in FIG. 2B, the EUV pellicle 202 may have an upward deflection movement that produces a convex shape 202b and a displacement $Z_2$ from its neutral position.

In another aspect, the amplitude of the deflection movements (i.e., displacements $Z_1$ and $Z_2$) of the EUV pellicle 202 will depend, in part, on the conditions for and the types of operations being performed by the various semiconductor process tools using or handling the reticle assembly. In addition, based on an understanding of the physical stresses on a pellicle as well as ongoing data generated by the present reticle assemblies, datasets of threshold deflection limits (i.e., maximum displacements for $Z_1$ and $Z_2$) and maximum number of pellicle deflection cycles may be available in memory devices or databases for reference by SOCs and semiconductor process systems during the monitoring of reticle assemblies.

Figure 3:
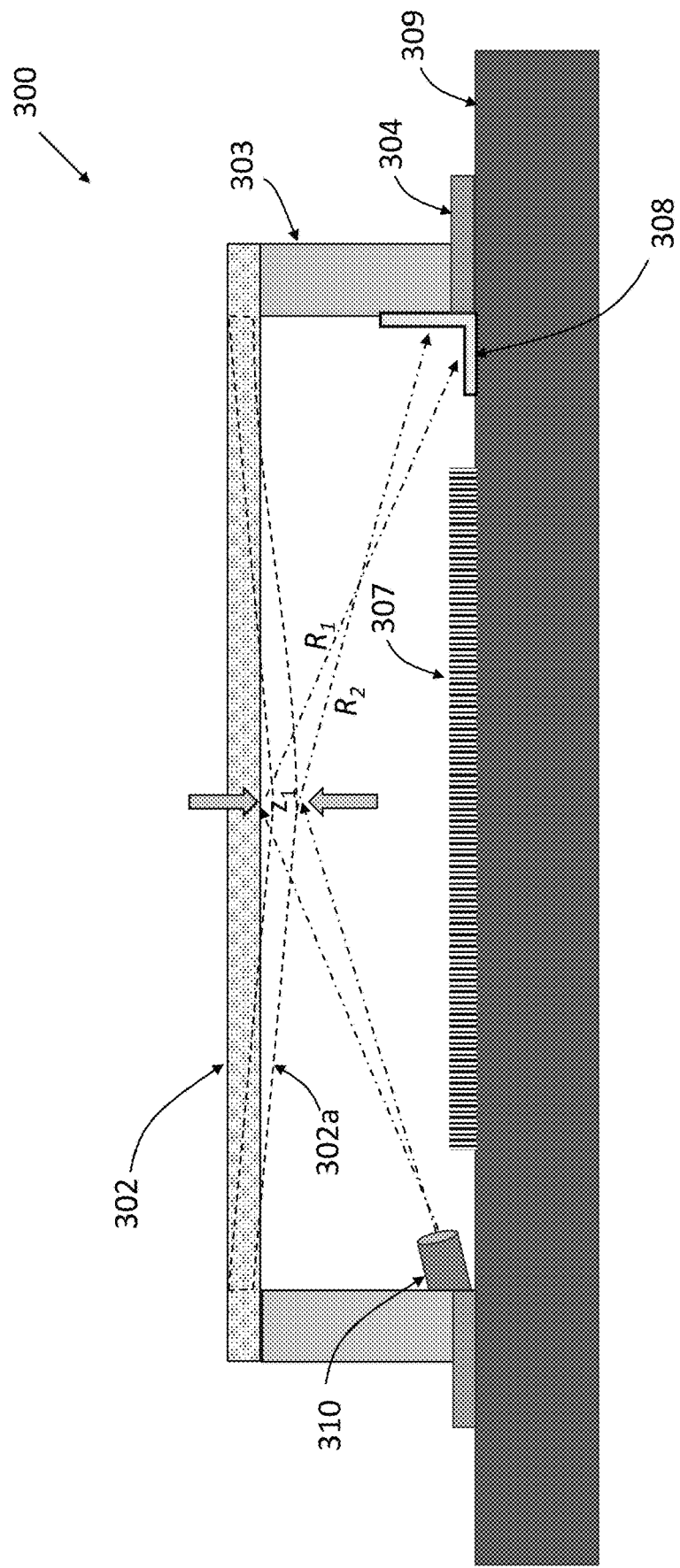
FIG. 3 shows an exemplary reticle assembly having optical components of an exemplary sensor assembly monitoring the movements of an EUV pellicle according to another aspect of the present disclosure.

FIG. 3 shows an exemplary reticle assembly 300 with onboard optical components, i.e., a light source 310 and a reflector 308 (e.g., corner cube mirror), from a sensor assembly that may be used to monitor the deflection movements of an EUV pellicle 302 according to an aspect of the present disclosure. In addition, the reticle assembly 300 may include a pellicle assembly 301 having the EUV pellicle 302 and a pellicle support frame 303 with attachment members 304, which are positioned on a reticle/mask 309 that has a patterning 307.

In this aspect, for conducting scans to monitor the EUV pellicle 302, the light source 310 may be configured to provide a light that is directed towards the EUV pellicle 302 and reflected towards the reflector 308, which is aligned with the light source 310. When the EUV pellicle 302 has a neutral position, the light may have a first reflection pattern $R_1$, and when deflected downward by a distance $Z_1$ in a concave position 302a, the light may have a second reflection pattern $R_2$, which may result in a different angle of reflection of the light by the EUV pellicle 302. Although not shown, when the EUV pellicle 302 is deflected upward in a convex position, the light may have a third reflection pattern. The different reflection patterns may be detected by a light detector according to various aspects of the present disclosure as described below.

In another aspect, the EUV reticle/mask 309 and patterning 307 may consist of a plurality of layers (e.g., an EUV Bragg mirror with forty (40) or more alternating silicon, molybdenum layers for the mirror elements, and tantalum-based layer for the patterned absorbing elements). The multilayers act to reflect the extreme ultraviolet light through Bragg diffraction, with the reflectance being a function of the incident angle and wavelength. In yet another aspect, the light source 310 may be, for example, a light emitting diode or a laser, and the reflector 308 may be, for example, a corner cube mirror or a pair of linear array of mirrors with offset angles of reflection designed to impart a multitude of reflections off of the pellicle membrane.

Figure 4:
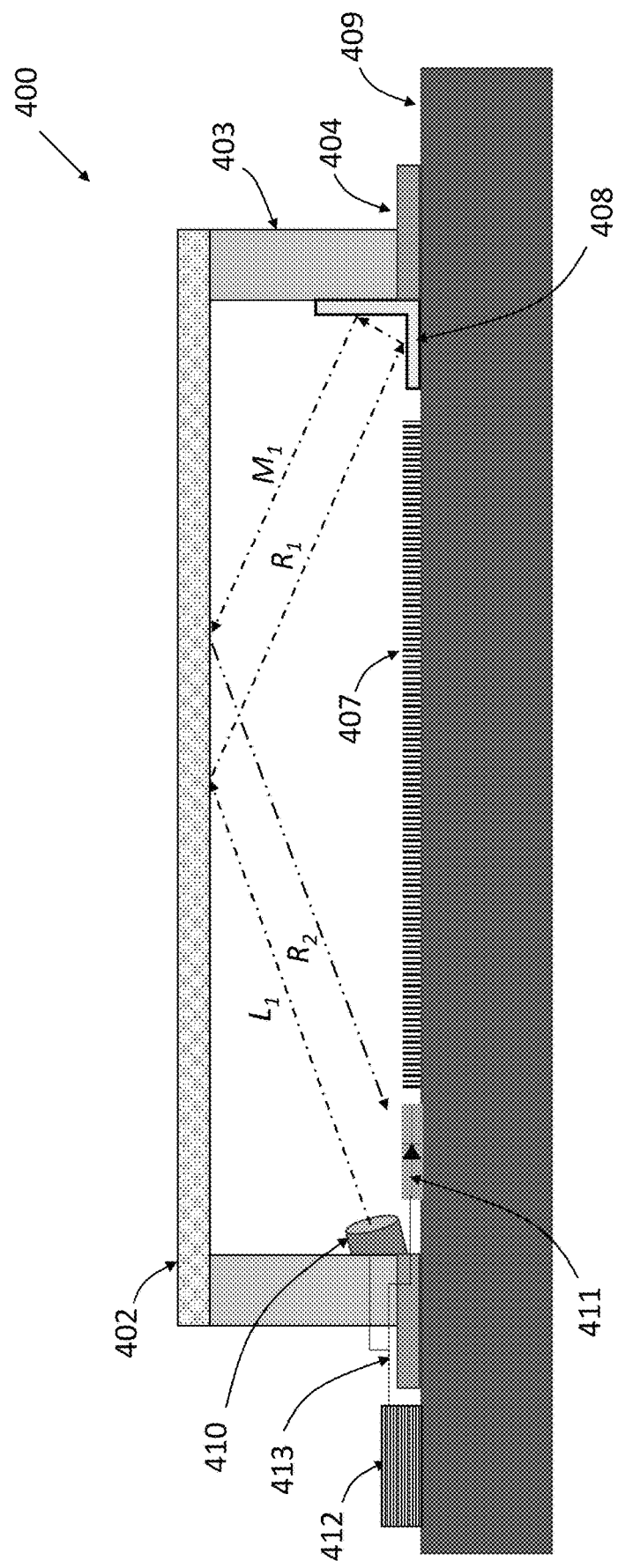
FIG. 4 shows an exemplary reticle assembly with a sensor assembly monitoring an EUV pellicle according to another aspect of the present disclosure.

FIG. 4 shows an exemplary reticle assembly 400 with optical components including a light source 410, a reflector 408, and a light detector 411 according to another aspect of the present disclosure for monitoring an EUV pellicle. The reticle assembly 400 includes an EUV pellicle 402, which is attached to a pellicle frame support 403 having attachment members 404, that is attached to a reticle/mask 409 in a standard assembly that has a patterning 407. In this aspect, the light source 410 (e.g., a light emitting diode (LED)), and light detector 411 (e.g., a photodiode), may both be coupled by a signal line 413 (e.g., a conventional wire bond or a subtractive process lithographically produced trace on the surface of the reticle 409), to a system-on-chip (SOC) 412 and may be surface bonded to the reticle 409. In an aspect, the SOC 412 may include a processor/controller such as a central processing unit (CPU), microprocessor, etc.

It should be understood that the signal line 413 may be replaced with short-range wireless technologies (e.g., near field communication (NFC)) and all of the various components herein may be equipped with a NFC capability, including the SOC 412, which may also be in wireless communications with a semiconductor process system.

As shown in FIG. 4, the light source 410 may emit a light ray $L_1$ that is reflected by a bottom surface of the pellicle membrane 402 as light $R_1$ towards a reflector 408 (e.g., a corner cube mirror). The light $R_1$ may be reflected by the reflector 408 back towards the bottom surface of the pellicle membrane 402 as light $M_1$ and is thereafter reflected as light $R_2$ to the light detector or photodiode 411. The photodiode 411 converts the light $R_2$ into an electrical current/signal.

In another aspect, the signal from the photodiode 411 may be directed to the processor/controller (not shown) on the SOC 412 or a system controller of a tool (not shown) used in a semiconductor process system, and the controller determines whether: a) deflections of the pellicle membrane 402 from initial position are occurring, or b) a current is absent or below a current threshold indicating a rupture event. The pellicle deflections may be determined using a time-of-flight calculation performed by the controller and additional optical components may be employed.

In another aspect, if a tool (not shown) in the semiconductor process system takes control of the optical and sensor components of a reticle assembly, as set forth in the present disclosure, it will override the commands of the onboard SOC so that the monitoring of the pellicle may be optimized/synchronized with the operations of the tool; for example, an EUV scanner may command a reticle assembly to monitor/sample only when stepping (i.e., between shots).

In accordance with the present disclosure, the analysis of the displacement of a pellicle may use a finite element and/or non-linear membrane approach, which may be employed to model the relationship between the displacements and the accompanying bi-axial stress on the pellicle membrane. The pellicle membranes are subjected to repeated mechanical stresses, extreme temperature cycling, and harsh hydrogen radical environmental conditions that may result in a reduction in the strength of the pellicle membranes through embrittlement, oxidation, fracture and in some cases rupture, i.e., catastrophic failure. Regardless of the choice of pellicle membrane materials, a means for monitoring pellicle membrane deflection, as taught by the present disclosure, is advantageous for process control. The pellicle stress data that may be acquired by the present optical and sensor components may be used to anticipate/predict failures (i.e., rupture) due to pellicle membrane fatigue and prevent rupture.

In addition to the present capability to detect and determine the magnitude and direction of a pellicle membrane deflection, an analysis of the intensity of light reflected off the pellicle membrane as a function of the number of scanner shots or exposures may also be measured and used to determine changes, if any, in the pellicle membrane materials (e.g., oxidation of the polysilicon core, degradation of emissivity layer, etc.) and used as inputs to a model for predicting pellicle membrane failure. Also, information relating to changes in the pellicle membrane's optical properties may be valuable for lithographic process control, as such changes may affect the results of lithographic scans.

For example, when a measured magnitude of a deflection beyond a threshold value is detected or the maximum number of deflections is exceeded, a notification/alarm could be triggered to stop any processing using the affected reticle assembly. Similarly, when a rupture event is detected, a notification/alarm can be triggered to alert an operator, who can take appropriate action. It should be understood that the present disclosure may be effective when a reticle assembly is inside or outside of an EUV scanner; for example, if a pellicle ruptures/breaks during transport or while a reticle assembly is in a stocker, the rupture will be detected and the operator will be alerted to stop further operations or to prevent the loading of the reticle assembly with the ruptured pellicle into an EUV scanner.

Figure 5:
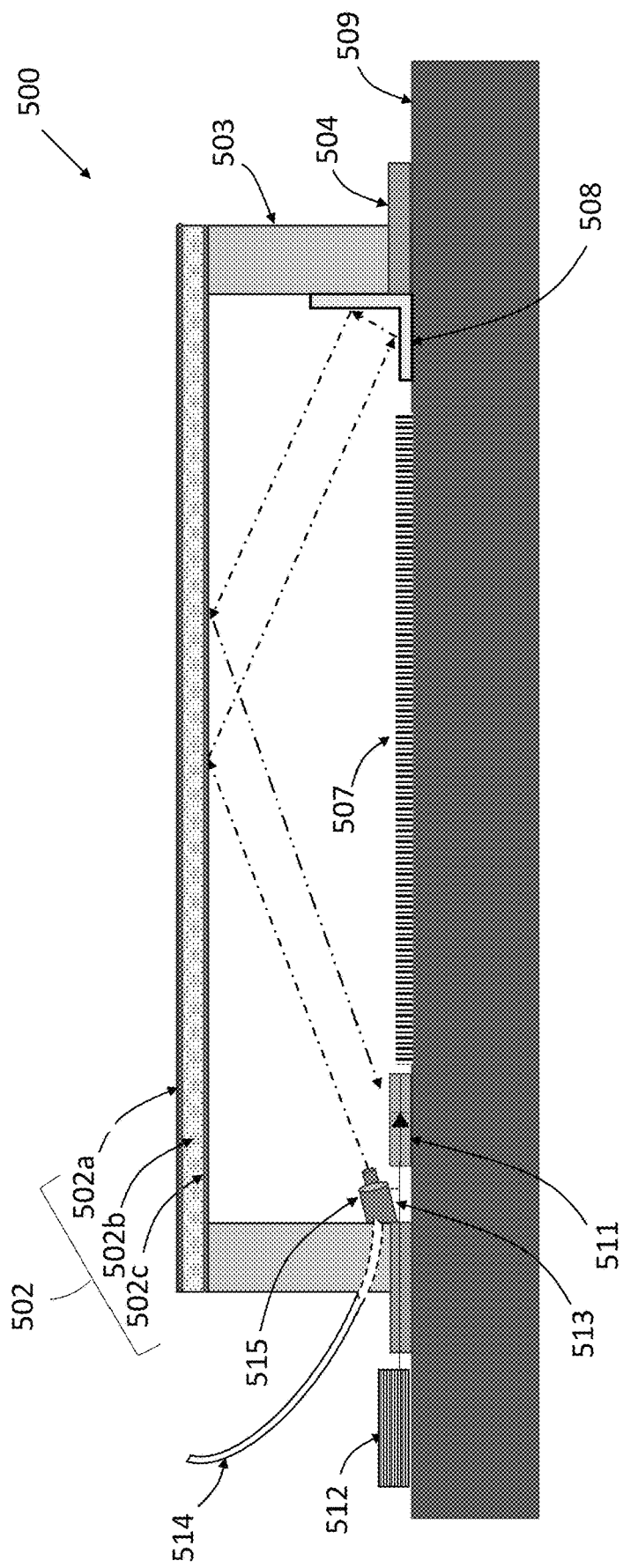
FIG. 5 shows another exemplary reticle assembly with another sensor assembly monitoring an EUV pellicle according to another aspect of the present disclosure.

FIG. 5 shows an exemplary reticle assembly 500 with optical components including a light source 515, a reflector 508, and a light detector 511 according to another aspect of the present disclosure for monitoring an EUV pellicle. The reticle assembly 500 includes an EUV pellicle 502, which is attached to a pellicle frame support 503 having attachment members 504, which are attached to a reticle/mask 509 in a standard assembly that has a patterning 507.

In this aspect, the light source 515 may be a laser (e.g., an ultrashort pulse laser) connected to a fiber optic cable 514, and light detector 511 may be a photodiode, both of which may be coupled by a signal line 513 (e.g., a conventional wire bond or a lithographically produced trace on the surface of the reticle 509), to a system-on-chip (SOC) 512 and may be surface bonded to the reticle 509. In another aspect, the optical components (i.e., the light source 515, the reflector 508, and the light detector 511), may also be built into the pellicle frame support, which is typically fabricated from single crystal silicon.

As shown in FIG. 5, in accordance with this aspect, the pellicle membrane 502 may have a core layer 502b with upper layer 502a and lower layer 502c. The core layer 502 may be formed of a silicon layer having properties of a single crystal, an amorphous or a polycrystalline with high transmittance and may be formed of a silicon layer containing boron (B), phosphorus (P), arsenic (Mo), or tungsten silicide (WSi), tantalum silicide (TaSi), and/or like materials. The center layer 502b may have a thickness of 100 nm or less and preferably has a transmittance of 90% or more for an EUV exposure light of 13.5 nm.

In addition, the pellicle 502 may have the upper layer 502a and lower layer 502c for reinforcing the mechanical strength and thermal properties of the pellicle core layer 502b and protecting the pellicle membrane 502 from the high temperatures generated during the EUV scan process, including protecting against oxidation. In an aspect, the upper layer 502a and lower layer 502c may be formed of a metal (e.g., ruthenium (Ru), molybdenum (Mo), etc.), graphene, carbon nanotube (CNT), or metal silicide that have the required emissivity layers and are good reflectors for typical LED wavelengths, such as 632 nm, and for lasers.

Figure 6:
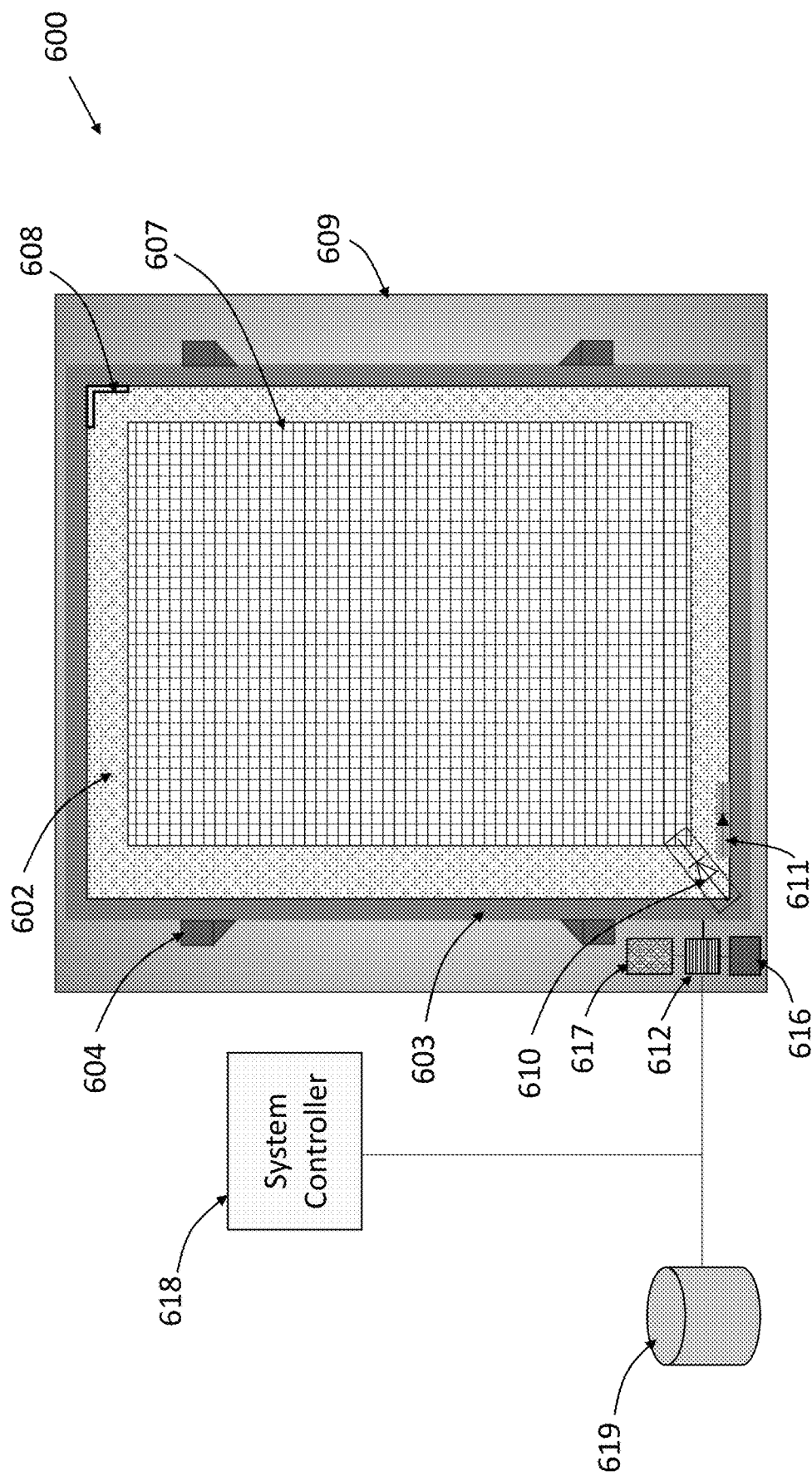
FIG. 6 shows a top view of an exemplary reticle assembly with a sensor assembly according to another aspect of the present disclosure.

FIG. 6 shows a top view of an exemplary reticle assembly 600 with a sensor assembly having optical components and sensor components according to another aspect of the present disclosure. The various elements of FIG. 6 may be included in a pellicle monitoring system to detect ruptured pellicle membranes and remove reticle assemblies with pellicles nearing a rupture event. The reticle assembly 600 includes an EUV pellicle 602, which is attached to a pellicle frame support 603 having attachment members 604, which are attached to a reticle/mask 609 with a pattern 607 in a standard assembly.

In this aspect, the optical components may include an LED light source 610, a corner cube mirror reflector 608, and a photodiode light detector 611 for optical monitoring of the EUV pellicle 602. As shown in FIG. 6, the LED light source 610, the corner cube mirror reflector 608, and the photodiode light detector may be positioned to be aligned across from each other to permit the reflection of light between them. It should be understood that the positions of the LED light source 610, the corner cube mirror reflector 608, and a photodiode light detector 611 may be relocated from those positions shown in FIG. 6, provided they are sufficiently aligned to permit the reflection of light between them.

In an aspect, an onboard system on chip (SOC) 612 may be mounted on reticle 609, and the sensor components may be provided as a separate device chip 616 having an accelerometer, pressure sensor, temperature sensor, etc. (not individually shown in FIG. 6) that may be also mounted on the reticle 609. Although not shown, the device chip 616 may be alternatively mounted onto the SOC 612. In another aspect, a battery 617 may be mounted on the SOC 612 (not shown) or placed adjacent to and coupled with the SOC 612 as shown in FIG. 6. In yet another aspect, an external power (i.e., a tool's power source) may be used to provide power to the SOC and onboard optical and sensor components. In a further aspect, the SOC 612 may be coupled with an external semiconductor process system controller 618, which may be a tool's processor or a fab network/system controller, and a data storage component 619, which may be a separate memory device mounted on the SOC 612, a memory storage device for a tool, or a database unit for a fab network system.

Figure 7:
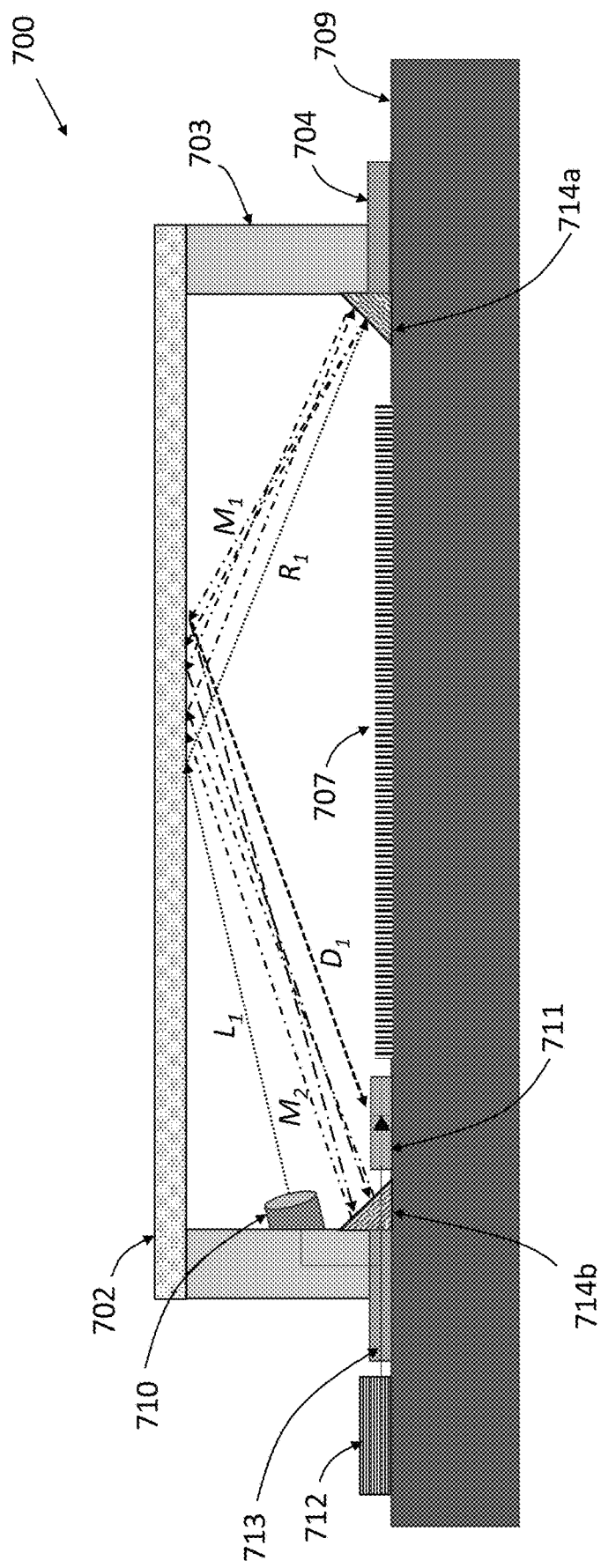
FIG. 7 shows yet another exemplary reticle assembly with a sensor assembly according to yet another aspect of the present disclosure.

FIG. 7 shows yet another exemplary reticle assembly 700 with a sensor assembly having a light source 710, a pair of first and second linear array of mirrors or reflectors 714a and 714b, and a light detector 711 according to another aspect of the present disclosure for monitoring an EUV pellicle 702. The reticle assembly 700 includes a standard assembly having a pellicle frame support 703 with attachment members 704 that are attached to a reticle/mask 709 that has a patterning 707, and a SOC 712.

In this aspect, the light source 710 (e.g., a light emitting diode (LED)), and light detector 711 (e.g., a photodiode), may both be coupled by a signal line 713 (e.g., a conventional wire bond or a lithographically produced trace on the surface of the reticle 709), to a system-on-chip (SOC) 712 and may be surface bonded to the reticle 709. It should be understood that the signal line 713 may be replaced with short-range wireless technologies (e.g., near field communication (NFC)) and all of the various components herein may be equipped with a NFC capability, including the SOC 712, which may be in communications with a semiconductor process system.

As shown in FIG. 7, in an aspect, the first and second linear array of mirrors 714a and 714b may have surfaces providing a plurality of different angles that will reflect light rays to slightly different regions of the bottom surface of the EUV pellicle membrane 702 with each subsequent reflection. In this aspect, the deflections of the pellicle 702 may be determined using a time-of-flight approach using passive optical elements (i.e., mirrors) to effect a multitude of reflections, e.g., 15-20 reflections, off of a pellicle membrane to make the light path length sufficiently long for measurement of a deflection (typically on the order of ~200-400 um) using relatively slow LED sources.

As shown in FIG. 7, the light source 710 may emit a light ray $L_1$ that reflects from the bottom surface of the pellicle membrane 702 towards the first linear array of mirrors 714a as light $R_1$. The light $R_1$ may be reflected by the first linear array of mirrors 714a as light $M_1$ back to the bottom surface of the pellicle membrane 702 and towards the second linear array of mirrors 714b. The second linear array of mirrors 714b reflects the light as light $M_2$ and the light is reflected back and forth between the first and second linear array of mirrors 714a and 714b as a plurality of $M_1$ and $M_2$ light rays until, at an appropriate time, the photodiode 711 converts a "final" light ray $D_2$ to an electrical current.

In another aspect, the current from the photodiode 711 may be directed to a processor (not shown) in the SOC 712, or a tool (not shown) used in a semiconductor process system, to determine if: a) deflections of the pellicle membrane 702 from an initial position are occurring, or b) a current is absent or below a threshold indicating a rupture event.

Figure 8:
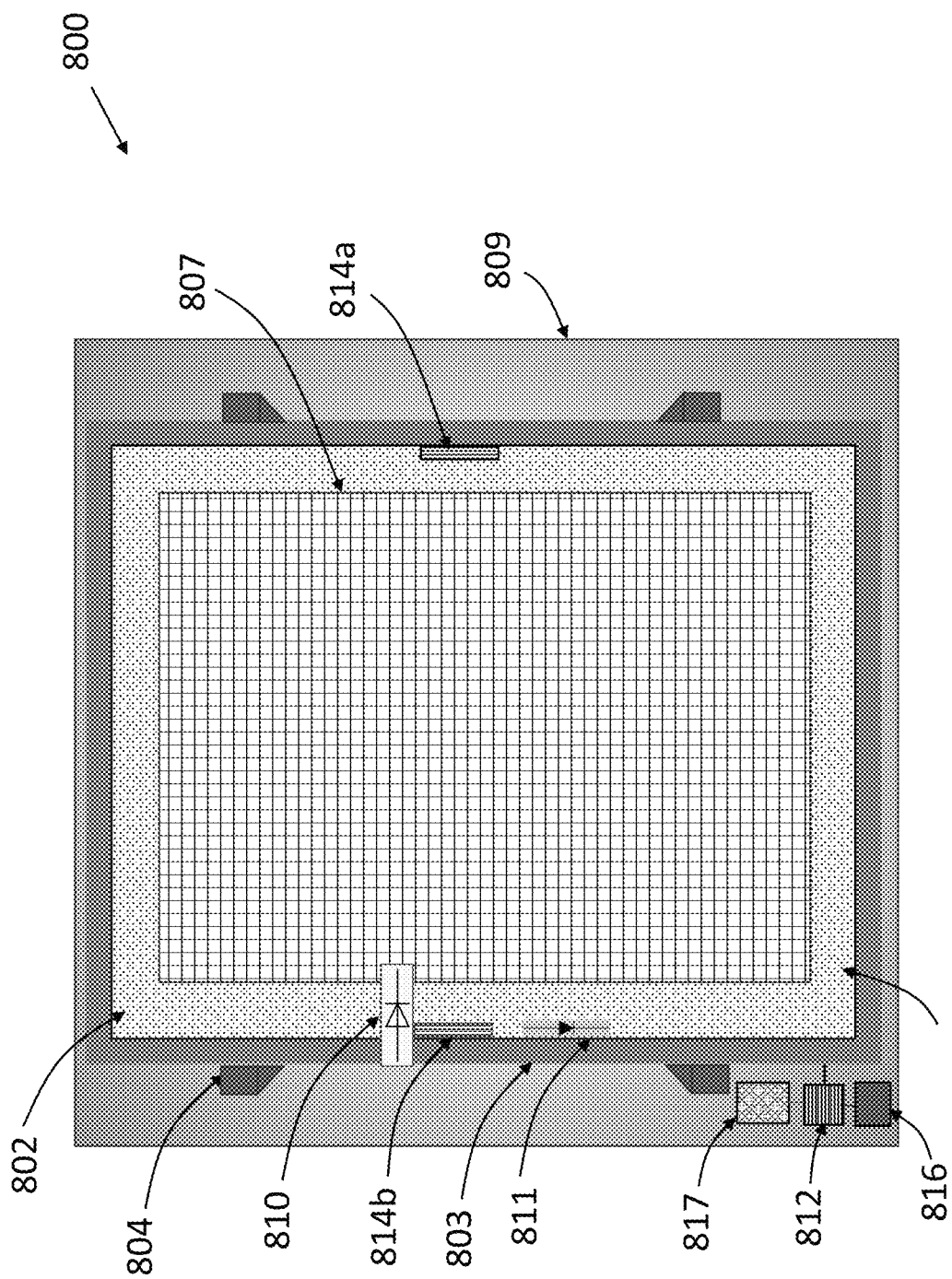
FIG. 8 shows a top view of yet another exemplary reticle assembly with a sensor assembly according to yet another aspect of the present disclosure.

FIG. 8 shows a top view of an exemplary reticle assembly 800 with a sensor assembly having optical components and sensor components according to another aspect of the present disclosure. The reticle assembly 800 includes an EUV pellicle 802, which is attached to a pellicle frame support 803 having attachment members 804 that are attached to a reticle/mask 809 with a pattern 807 in a standard assembly.

In this aspect, the optical components may include an LED light source 810, a first and second linear array of mirrors 814a and 814b, and a photodiode light detector 811 for optical monitoring of the EUV pellicle 802. An onboard system on chip (SOC) 812 may be mounted on the reticle 809. In an aspect, the sensor components may be provided as a separate device chip 816 having an accelerometer, pressure sensor, temperature sensor, etc. (not individually shown in FIG. 8) that may be also mounted on the reticle 809. Although not shown, the device chip 816 may be alternatively mounted onto the SOC 812. In another aspect, a battery 817 may be mounted on the SOC 812 (not shown) or placed adjacent to and coupled with the SOC 812 as shown in FIG. 8.

As shown in FIG. 8, the first and second linear array of mirrors 814a and 814b may be positioned to be aligned across from each other to permit the reflection of light back and forth between them. It should be understood that the positions of the first and second linear array of mirrors 814a and 814b may be relocated from those positions shown in FIG. 8, provided they are sufficiently aligned to permit the reflection of light between them. Similarly, the LED light source 810 may be suitably positioned to facilitate the reflection of light back and forth between the first and second linear array of mirrors 814a and 814b, and the photodiode light detector 811 may be suitably positioned to detect the light following an appropriate number of reflections the first and second linear array of mirrors 814a and 814b.

Figure 9:
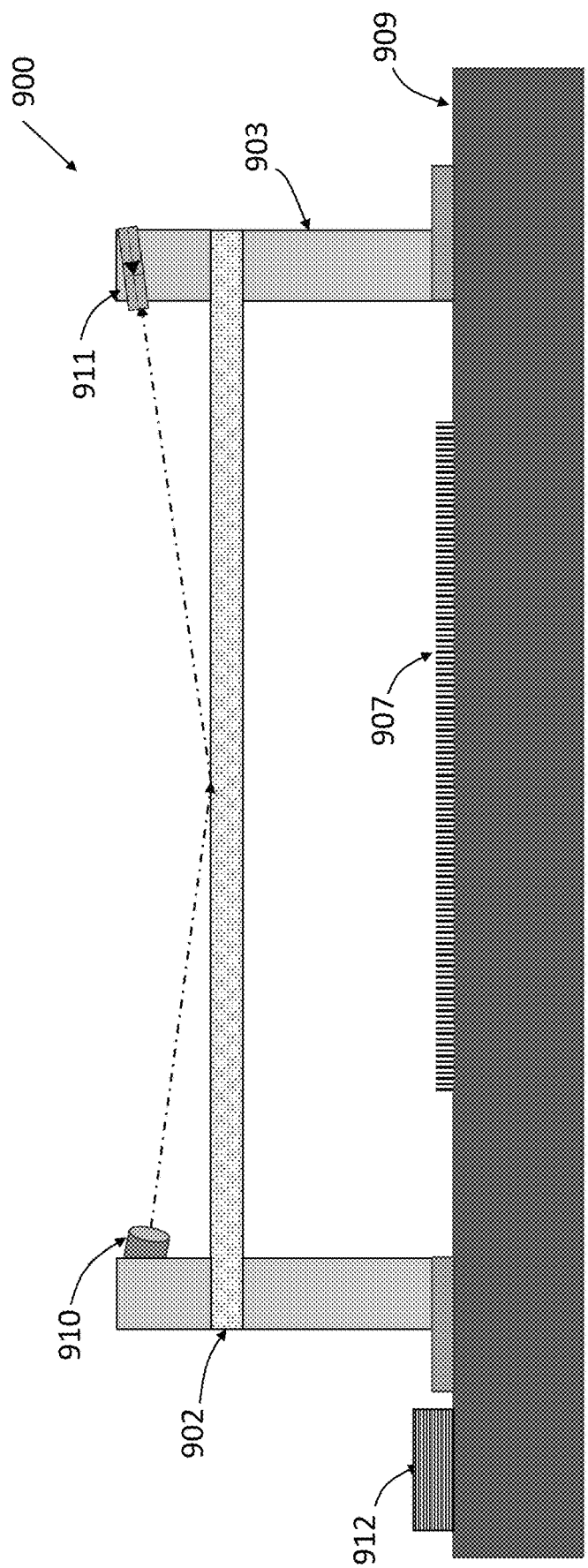
FIG. 9 shows an exemplary reticle assembly having exemplary optical components of a sensor assembly in an alternative position to monitor the movements of an EUV pellicle according to another aspect of the present disclosure.

FIG. 9 shows an exemplary reticle assembly 900 having exemplary optical components, including a light source 910 and a light detector 911 of a sensor assembly, that are positioned in an upper portion of a pellicle frame support 903 in the reticle assembly 900. In an aspect, the light source 910 and a light detector 911 are aligned to acquire measurements from light that is reflected from an upper surface of the pellicle 902. The reticle assembly 900 may include various aspects and elements from the other reticle assemblies disclosed herein, including a reticle 909 with patterning 907 and a SOC 912, as well as other conventional elements that are present in a reticle assembly.

In this aspect, the optical components of the light source 910 and light detector 911), may be built into the pellicle frame support 903 or be discreet units attached to the pellicle frame support 903 to monitor the movements of EUV pellicle 902. The positioning of the light source 910 and a light detector 911 in the upper portion of the pellicle frame support 903 may simplify the construction of the reticle assembly 900.

Figure 10:
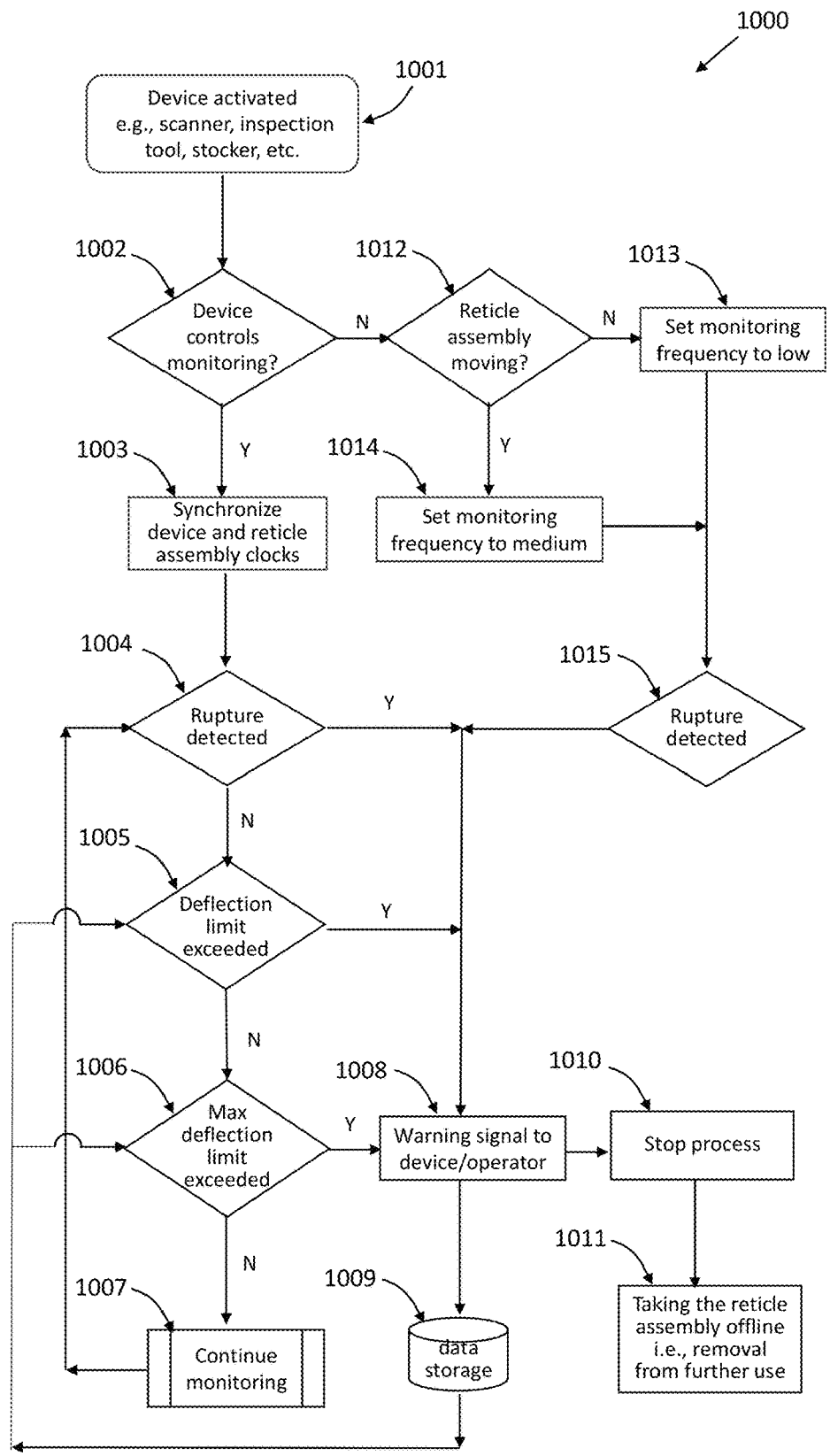
FIG. 10 shows a simplified decision diagram of an exemplary method according to an aspect of the present disclosure.

FIG. 10 shows a simplified decision diagram 1000 of an exemplary method directed to the communications between one or more reticle assemblies and devices in a semiconductor process system according to an aspect of the present disclosure. In this aspect, as shown in step/node 1001, a device (e.g., an EUV scanner, inspection tool, stocker, etc.) may be activated for operations in a semiconductor process system. In step 1002, the device may be enabled to actively monitor and control the use of the reticle assemblies. In step 1003, as part of the active control, the device and the reticles may be required to optimize/synchronize their clock speeds for performing various tasks (e.g., monitoring when stepping by an EUV scanner (i.e., between scans/shots).

Further to this aspect, in step 1004, a pellicle in a reticle assembly may rupture and be detected by the device or a SOC onboard the reticle assembly, while being monitored by a device. The detection of such a rupture may lead to, in step 1008, a warning signal being transmitted to the device and/or an operator.

If no rupture occurs or is detected by the device or the SOC onboard the reticle assembly, in step 1005, the z-direction displacements during deflections of a pellicle may be monitored and compared against data for a threshold deflection limit that may be available in a data storage 1009. The detection of such a deflection having a magnitude exceeding the threshold deflection limit may lead to, in step 1008, a warning signal being transmitted to the device and an operator.

If no deflection exceeding the threshold deflection limit is detected by the device or the SOC onboard the reticle assembly, in step 1006, the total number of deflections of a pellicle may be monitored and compared against data for a maximum number of deflections limit for the pellicle that may be available in a data storage 1009. The detection of the total number of deflections exceeding the maximum number of deflections limit may lead to, in step 1008, a warning signal being transmitted to the device and an operator.

If no deflection exceeding the threshold deflection limit is detected by the device or the SOC onboard the reticle assembly, in step 1007, the device may continue monitoring by repeating steps 1004 through 1006.

In the event that step 1008 occurs, as shown in FIG. 10, the warning signal transmitted to the device or an operator may lead to a collection of operational data (e.g., type of event, the number of the deflections, acceleration/velocity information, time stamp, pressure conditions, temperature conditions, etc.) from steps 1004, 1005 or 1006 being recorded in the data storage 1009. Such data/information may advance a user's ability to determine the root cause of a given pellicle failure and make modifications to eliminate that failure mode, which may provide a significant competitive advantage.

In addition, in step 1010, the warning signal transmitted to the device or an operator may lead to the stopping of the process or operation being performed by the device, and in step 1011, the at-issue reticle assembly may be taken offline and removed from further use to repaired or discarded.

In another aspect, if in step 1002, a device is not enabled to actively control the monitoring of a reticle assembly, an onboard SOC for a reticle assembly may monitor the condition of the pellicle in a "standalone mode" in accordance with the various aspects of the present disclosure. It is understood that the SOC may be in communications with a host tool, such as an EUV scanner or inspection tool, while in the standalone mode. In step 1012, for example, the reticle assembly having an onboard SOC may, using one or more sensor components, determine if the reticle assembly is being moved, e.g., using an accelerometer.

If the reticle assembly is not being moved (e.g., at rest in storage or library), in step 1013, a monitoring frequency for the pellicle may be set at a low rate. For example, a reticle assembly sitting in a storage stocker with no movement for a month could be monitored at a low rate (e.g., 1x per minute or more). If the reticle assembly is being moved but not being used for scanning, in step 1014, a monitoring frequency for the pellicle may be set at a medium rate (e.g., 1x per a fraction of minute). On the other hand, a reticle assembly positioned in a critical tool, such as a scanner, would be monitored at a high frequency (e.g., 1x per second), while in printing. If the monitoring of the reticle assembly in steps 1013 or 1014 results in a detection of a rupture, as shown in step 1015, such a rupture may also lead to, in step 1008, a warning signal being transmitted to the device and/or an operator, as in step 1004.

FIG. 11 shows a simplified flow diagram for a further exemplary method according to a further aspect of the present disclosure. In an aspect, the present method may be able to provide monitoring of pellicles to prevent ruptures and to remove ruptured pellicles to prevent extending the contamination of a semiconductor process system with pellicle fragments and causing processing delays.

The operation 1101 may be directed to providing a reticle assembly having a pellicle with an onboard sensor assembly, including optical and sensor components and a controller, for monitoring the condition of the pellicle.

The operation 1102 may be directed to providing a connection between one or more devices in a semiconductor operations system and the onboard sensor assembly to monitor the pellicle and exchange data.

The operation 1103 may be directed to providing data storage coupled with the semiconductor operations system that stores threshold data for pellicle deflection limits and maximum pellicle deflection cycles for the reticle assembly.

The operation 1104 may be directed to removing the reticle assembly from further use by the semiconductor operations system when the pellicle deflection limit or maximum pellicle deflection cycles is reached, or if the pellicle is ruptured.

It will be understood that any specific property described herein for a specific reticle assembly or specific sensor assembly may also generally hold for any of the other reticle assembly or sensor assembly described herein. It will also be understood that any specific property described herein for a specific method may generally hold for any of the other methods described herein. Furthermore, it will be understood that for any tool, system, or method described herein, not necessarily all the components or operations described will be enclosed in the tool, system, or method, but only some (but not all) components or operations may be enclosed.

To more readily understand and put into practical effect the present reticle assemblies and sensor assemblies, they will now be described by way of examples. For the sake of brevity, duplicate descriptions of features and properties may be omitted.

EXAMPLES

Example 1 provides a sensor assembly including optical components including a light source, a light detector, and a reflector, sensor components including a pressure sensor and an accelerometer, and a controller coupled to the optical components and the sensor components, the controller being further coupled to one or more semiconductor process tools, for which the sensor assembly monitors a pellicle attached to a pellicle support frame positioned on a reticle.

Example 2 may include the sensor assembly of example 1 and/or any other example disclosed herein, further including the light source being configured to direct a light towards the pellicle and the light reflected by the pellicle toward the reflector, the reflector being configured to receive the light from the pellicle and reflect the light back toward the pellicle, the light is further reflected by the pellicle towards the light detector, and the light detector being configured to detect the light and generate signals that are transmitted to the controller, for which the controller determines whether a movement of the pellicle exceeds its threshold deflection limit or the number of pellicle deflection cycles based on the signal, or whether the pellicle is ruptured based on the signal.

Example 3 may include the sensor assembly of example 1 and/or any other example disclosed herein, The sensor assembly of claim 1, for which the optical components are integrated into the pellicle support frame.

Example 4 may include the sensor assembly of example 1 and/or any other example disclosed herein, for which the sensor components further include a temperature sensor.

Example 5 may include the sensor assembly of example 1 and/or any other example disclosed herein, for which the light source further includes a light emitting diode or a laser.

Example 6 may include the sensor assembly of example 1 and/or any other example disclosed herein, for which the light detector further includes a photodiode detector.

Example 7 may include the sensor assembly of example 1 and/or any other example disclosed herein, for which the reflector further includes a corner cube mirror or a pair of linear array of mirrors.

Example 8 may include the sensor assembly of example 2 and/or any other example disclosed herein, further including the light source being positioned to direct the light towards a bottom surface of the pellicle and the light reflected by the bottom surface pellicle toward the reflector, or positioned to direct the light towards an upper surface of the pellicle and the light reflected by the upper surface pellicle toward the reflector.

Example 9 may include the sensor assembly of example 4 and/or any other example disclosed herein, for which the controller further includes a system on chip (SOC) positioned on the reticle, the SOC includes a microcontroller and a wireless transmitter.

Example 10 provides for a pellicle monitoring system including a plurality of reticle assemblies, each reticle assembly including a reticle, a pellicle, a pellicle support frame, optical components, and sensor components, for which the optical and sensor components generate signals relating to monitoring movements and condition of the pellicle, a system controller being configured to couple with the plurality of reticle assemblies to receive signals from their optical and sensor components, and a data storage coupled with the system controller for storing the signals received from each reticle assembly and providing threshold data for pellicle deflection limits and the maximum number of pellicle deflection cycles, for which the plurality of reticle assemblies are used in a semiconductor process system.

Example 11 may include the pellicle monitoring system of example 10 and/or any other example disclosed herein, for which the optical components further include a light source, a light detector, and at least one reflector, and for which the sensor components further include a pressure sensor, an accelerometer, and a temperature sensor.

Example 12 may include the pellicle monitoring system of example 10 and/or any other example disclosed herein, for which the system controller directs the semiconductor process system to exclude one of the plurality of reticle assemblies from use in semiconductor processes based on the signals received from the one reticle assembly indicating a below threshold current and a ruptured pellicle.

Example 13 may include the pellicle monitoring system of example 10 and/or any other example disclosed herein, for which the system controller directs the semiconductor process system to exclude one of the plurality of reticle assemblies from use in a semiconductor process system based on the signals received from the one reticle assembly indicating movements of an individual pellicle of the one reticle assembly exceed either the pellicle deflection limit or the maximum number of pellicle deflection cycles.

Example 14 may include the pellicle monitoring system of example 10 and/or any other example disclosed herein, for which the optical components are integrated into the pellicle support frame.

Example 15 may include the pellicle monitoring system of example 10 and/or any other example disclosed herein, for which the reticle assembly further includes a system on chip (SOC), the SOC includes a microcontroller and a wireless transmitter, for which the wireless transmitter is connected with the system controller.

Example 16 provides for a method including monitoring a plurality of reticle assemblies, each reticle assembly including a reticle, a pellicle, a pellicle support frame, optical components, and sensor components, for which the pellicle attached to the pellicle support frame, and the optical and sensor components generate signals relating to monitoring movements and condition of the pellicle, providing a system controller configured to be coupled with the plurality of reticle assemblies for receiving signals from their optical and sensor components, and providing a data storage coupled to the system controller for storing the signals received from each reticle assembly and providing threshold data for pellicle deflection limits and maximum number of pellicle deflection cycles to the system controller, for which one of the plurality of reticle assemblies is removed from use by a semiconductor process system when the pellicle for one of the plurality of reticle assemblies reaches its pellicle deflection limit or maximum number of pellicle deflection cycles, or when the pellicle is ruptured.

Example 17 may include the method of example 16 and/or any other example disclosed herein, for which the optical components further include a light source, a light detector, and at least one reflector, and for which the sensor components further include a pressure sensor, an accelerometer, and a temperature sensor.

Example 18 may include the method of example 17 and/or any other example disclosed herein, further including monitoring the pellicle by directing light from the light source towards the pellicle, for which the light is reflected by the pellicle towards the at least one reflector, and the light is reflected back by the one reflector toward the pellicle and the light is reflected by the pellicle toward the light detector, and the light is detected by the light detector, and the light detector transmits signals to the system controller to determine whether the pellicle deflection limits or maximum pellicle deflection cycles is reached.

Example 19 may include the method of example 17 and/or any other example disclosed herein, for which the at least one reflector further includes a first and second linear array of mirrors, and for which the method further includes monitoring the pellicle by directing a light from the light source towards the pellicle, for which the light is reflected by the pellicle towards the first linear array of mirrors, and as a first step, the light is reflected back by the first linear array of mirrors toward the pellicle and the light is reflected by the pellicle toward the second linear array of mirrors, and as a second step, the light is reflected by the second linear array of mirrors towards the pellicle and the light is reflected by the pellicle towards the first linear array of mirrors, for which the first step and second step repeat as a cycle as the light travels to-and-fro between the first linear array of mirrors, the pellicle, and the second linear array, and the light detector detects the light after a pre-determined number of cycles and generates a signal to the system controller to determine whether the pellicle deflection limit or maximum number of pellicle deflection cycles is reached.

Example 20 may include the method of example 17 and/or any other example disclosed herein, for which monitoring a plurality of reticle assemblies further includes the light detector from one of the plurality of reticle assemblies transmitting a current signal that is below a standard threshold that indicates the pellicle is ruptured.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The terms "and" and "or" herein may be understood to mean "and/or" as including either or both of two stated possibilities.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A sensor assembly comprising:
   optical components comprising a light source, a light detector, and a reflector;
   sensor components comprising a pressure sensor and an accelerometer; and
   a controller coupled to the optical components and the sensor components, the controller being further coupled to one or more semiconductor process tools,
   wherein the sensor assembly monitors a pellicle attached to a pellicle support frame positioned on a reticle;
   the light source being configured to direct a light towards the pellicle and the light reflected by the pellicle toward the reflector;
   the reflector being configured to receive the light from the pellicle and reflect the light back toward the pellicle, the light is further reflected by the pellicle towards the light detector; and
   the light detector being configured to detect the light and generate signals that are transmitted to the controller, wherein the controller determines whether a movement of the pellicle exceeds its threshold deflection limit or a maximum number of pellicle deflection cycles based on the signal, or whether the pellicle is ruptured based on the signal.

2. The sensor assembly of claim 1, wherein the optical components are integrated into the pellicle support frame.

3. The sensor assembly of claim 1, wherein the sensor components further comprises a temperature sensor.

4. The sensor assembly of claim 3, wherein the controller further comprises a system on chip (SOC) positioned on the reticle, the SOC comprises a microcontroller and a wireless transmitter.

5. The sensor assembly of claim 1, wherein the light source further comprises a light emitting diode or a laser.

6. The sensor assembly of claim 1, wherein the light detector further comprises a photodiode detector.

7. The sensor assembly of claim 1, wherein the reflector further comprises a corner cube mirror or a pair of linear array of mirrors.

8. The sensor assembly of claim 1, further comprising:
   the light source being positioned to direct the light towards a bottom surface of the pellicle and the light reflected by the bottom surface pellicle toward the reflector, or positioned to direct the light towards an upper surface of the pellicle and the light reflected by the upper surface pellicle toward the reflector.

9. A method comprising:
monitoring a plurality of reticle assemblies, each reticle assembly comprising a reticle, a pellicle, a pellicle support frame, optical components, and sensor components, wherein the pellicle attached to the pellicle support frame, and the optical and sensor components generate signals relating to monitoring movements and condition of the pellicle;
providing a system controller configured to be coupled with the plurality of reticle assemblies for receiving signals from their optical and sensor components; and
providing a data storage coupled to the system controller for storing the signals received from each reticle assembly and providing threshold data for pellicle deflection limits and maximum number of pellicle deflection cycles to the system controller,
wherein one of the plurality of reticle assemblies is removed from use by a semiconductor process system when the pellicle for one of the plurality of reticle assemblies reaches its pellicle deflection limit or maximum number of pellicle deflection cycles, or when the pellicle is ruptured;
further comprising monitoring the pellicle by directing light from the light source towards the pellicle, wherein the light is reflected by the pellicle towards the at least one reflector, and the light is reflected back by the one reflector toward the pellicle and the light is reflected by the pellicle toward the light detector, and the light is detected by the light detector, and the light detector transmits signals to the system controller to determine whether the pellicle deflection limits or the maximum pellicle deflection cycles is reached.

10. The method of claim 9, wherein the optical components further comprise a light source, a light detector, and at least one reflector; and
wherein the sensor components further comprise a pressure sensor, an accelerometer, and a temperature sensor.

11. The method of claim 10, wherein the at least one reflector further comprises a first and second linear array of mirrors, and wherein the method further comprises:
monitoring the pellicle by directing light from the light source towards the pellicle, wherein the light is reflected by the pellicle towards the first linear array of mirrors, and
as a first step, the light is reflected back by the first linear array of mirrors toward the pellicle, and the light is reflected by the pellicle toward the second linear array of mirrors, and
as a second step, the light is reflected by the second linear array of mirrors towards the pellicle, and the light is reflected by the pellicle towards the first linear array of mirrors,
wherein the first step and second step repeat as a cycle as the light travels to-and-fro between the first linear array of mirrors, the pellicle, and the second linear array, and
the light detector detects the light after a pre-determined number of cycles and generates a signal to the system controller to determine whether the pellicle deflection limit or the maximum number of pellicle deflection cycles is reached.

12. The method of claim 10, wherein monitoring a plurality of reticle assemblies further comprises the light detector from one of the plurality of reticle assemblies transmitting a current signal that is below a standard threshold that indicates the pellicle is ruptured.

* * * * *